United States Patent
He et al.

(10) Patent No.: US 9,076,508 B2
(45) Date of Patent: *Jul. 7, 2015

(54) BUILT-IN SELF TRIM FOR NON-VOLATILE MEMORY REFERENCE CURRENT

(71) Applicants: Chen He, Austin, TX (US); Richard K. Eguchi, Austin, TX (US); Yanzhuo Wang, Austin, TX (US)

(72) Inventors: Chen He, Austin, TX (US); Richard K. Eguchi, Austin, TX (US); Yanzhuo Wang, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/180,621

(22) Filed: Feb. 14, 2014

(65) Prior Publication Data

US 2014/0160869 A1  Jun. 12, 2014

Related U.S. Application Data

(63) Continuation of application No. 13/286,175, filed on Oct. 31, 2011, now Pat. No. 8,687,428.

(51) Int. Cl.

| | | |
|---|---|---|
| G11C 16/04 | (2006.01) | |
| G11C 5/14 | (2006.01) | |
| G11C 29/02 | (2006.01) | |
| G11C 29/44 | (2006.01) | |
| G11C 16/00 | (2006.01) | |
| G11C 29/04 | (2006.01) | |

(52) U.S. Cl.
CPC *G11C 5/14* (2013.01); *G11C 16/00* (2013.01); *G11C 29/021* (2013.01); *G11C 29/028* (2013.01); *G11C 29/4401* (2013.01); *G11C 2029/0409* (2013.01)

(58) Field of Classification Search
USPC ............... 365/185.09, 233.1, 185.18, 236
See application file for complete search history.

(56) References Cited

U.S. PATENT DOCUMENTS

| | | |
|---|---|---|
| 5,822,250 A | 10/1998 | Krzentz |
| 6,826,103 B2 | 11/2004 | Moon et al. |
| 7,342,460 B2 | 3/2008 | Batchelor et al. |
| 7,782,664 B2 | 8/2010 | Gasquet et al. |
| 2002/0196691 A1 | 12/2002 | Pekny |
| 2003/0169622 A1* | 9/2003 | Ooishi et al. ............. 365/185.21 |
| 2004/0085843 A1 | 5/2004 | Moon et al. |
| 2009/0034332 A1 | 2/2009 | Noichi |

* cited by examiner

*Primary Examiner* — Vu Le
(74) *Attorney, Agent, or Firm* — Jonathan N. Geld

(57) ABSTRACT

A non-volatile memory built-in self-trim mechanism is provided by which product reliability can be improved by minimizing drift of reference current used for accessing the non-volatile memory and for performing initial trimming of the reference current. Embodiments perform these tasks by using an analog-to-digital converter to provide a digital representation of the reference current (Iref) and then comparing that digital representation to a stored target range value for Iref and then adjusting a source of Iref accordingly. For a reference current generated by a NVM reference bitcell, program or erase pulses are applied to the reference cell as part of the trimming procedure. For a reference current generated by a bandgap-based circuit, the comparison results can be used to adjust the reference current circuit. In addition, environmental factors, such as temperature, can be used to adjust the measured value for the reference current or the target range value.

9 Claims, 4 Drawing Sheets

BUILT-IN SELF TRIM FOR NON-VOLATILE MEMORY REFERENCE CURRENT

BACKGROUND

1. Field

This disclosure relates generally to non-volatile memories, and more specifically, to a built-in self trim mechanism for a reference current used in accessing non-volatile memories.

2. Related Art

Non-volatile memories typically rely upon a reference current (Iref) to distinguish whether a memory cell stores a zero value (e.g., less than Iref) or a one value (e.g., greater than Iref). In order to generate Iref, many non-volatile memory designs use a non-volatile memory bitcell as a reference cell. To ensure performance and reliability of the non-volatile memory array, the reference cell should be stable and not drift significantly over time. But, like many other semiconductor devices, a reference cell can be subject to environmental effects, as well as data retention errors and read disturb errors.

While reference cells are typically initially trimmed by a manufacturer of the non-volatile memory, there is no mechanism for the reference cell to be adjusted or re-trimmed in the field or by a customer incorporating the non-volatile memory in a subsequent product. Further, initial trimming of a reference cell can be a time-consuming procedure that utilizes equipment external to the non-volatile memory, or a package incorporating the non-volatile memory, and therefore can be costly in terms of resources and reductions in production volume. It is therefore desirable to have a built-in self-trim mechanism incorporated into non-volatile memory packages. It is further desirable that such a built-in self-trim mechanism be usable to both minimize reference drift in the field as well as aiding in initial trimming of the reference cell.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

A non-volatile memory built-in self-trim mechanism is provided by which product reliability can be improved by minimizing drift of reference current used for accessing a non-volatile memory. Embodiments of the built-in self-trim mechanism can also refresh a reference current if that current is disturbed from its factory-set state. Embodiments of the built-in self-trim mechanism can also be used to perform initial trimming of the reference current. Embodiments of the built-in self-trim mechanism perform these tasks by using an analog-to-digital converter to provide a digital representation of the reference current (Iref) and then comparing that digital representation to a stored target value for Iref and then adjusting a source of Iref accordingly. For a reference current generated by a non-volatile memory reference cell, program or erase pulses can be applied to the reference cell as part of the trimming procedure. For a reference current generated by a bandgap-based circuit, the comparison results can be used to adjust the reference current circuit. In addition, environmental factors, such as temperature, can be used to adjust one or more of the measured value for the reference current or the target value of the reference current.

Non-volatile memories use a reference current to read data stored in a non-volatile memory (NVM) array. The reference current is used to distinguish between a stored zero and a stored one. If the value of the reference current changes over the course of the lifetime of the NVM device, this could render the device unusable because the data values could not be properly read. The reference current is also affected by environmental factors such as temperature and voltage or current variations can cause the reference current to drift. In addition, power cycling and extreme operating conditions can also disturb the value of the reference current. Accidental causes (e.g., re-programming of a reference cell) and unusual natural causes (e.g., cosmic radiation) can also affect the reference current.

In order to help to ensure continued usability of an NVM device over the course of the NVM device's life, it is desirable to provide a mechanism by which the reference current can be adjusted to the initial known value of the reference current or an acceptable range thereof. Such adjustment, or trimming, can be performed by comparing a present value of the reference current with an initial, calibrated value of the reference current and make appropriate adjustments as needed.

Figure 1:
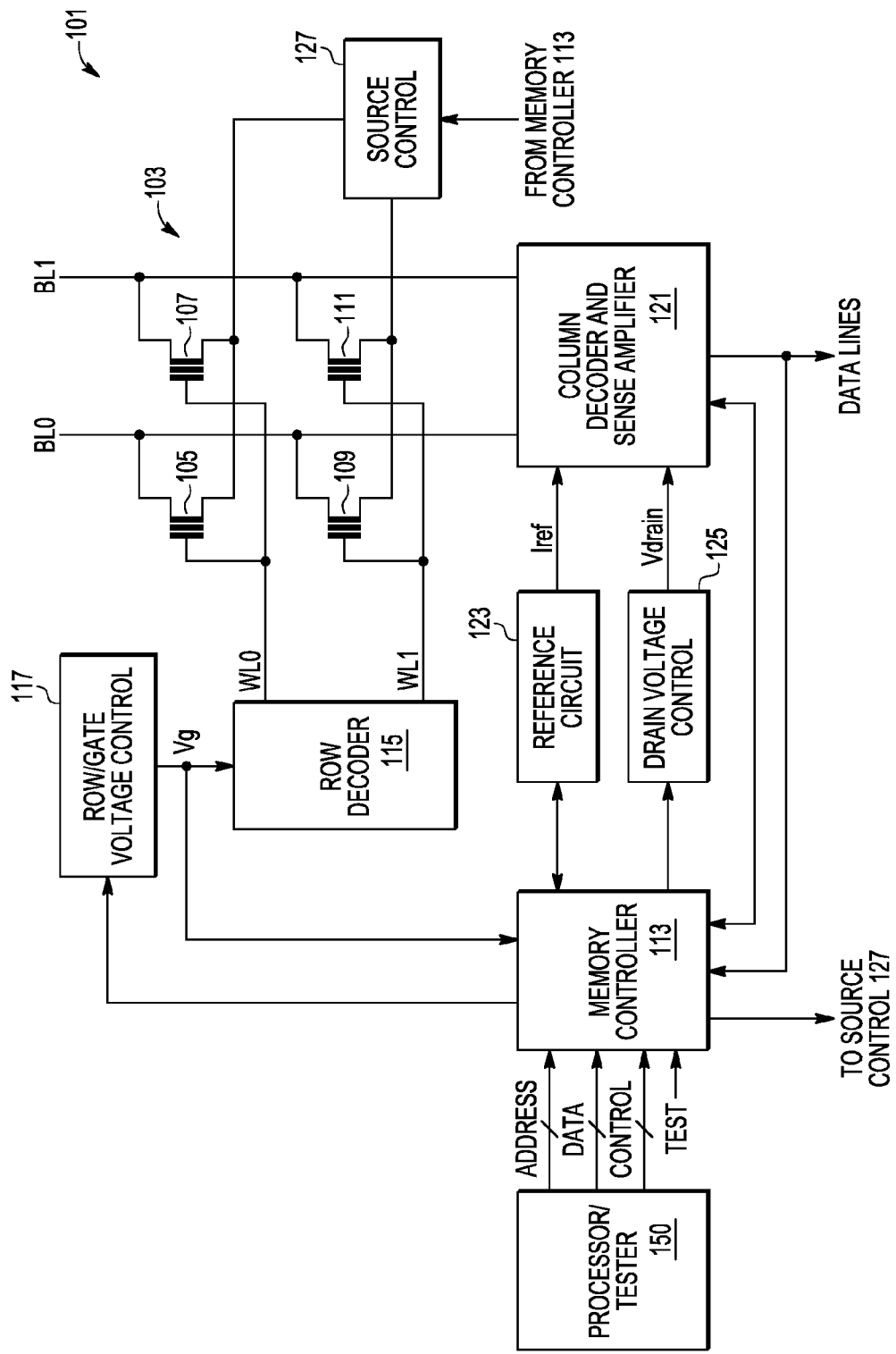
FIG. 1 is a simplified block diagram of a non-volatile memory usable with embodiments of the present invention.

FIG. 1 is a simplified block diagram of a non-volatile memory 101 usable with embodiments of the present invention. NVM 101 includes an array 103 of NVM cells along with circuits used to access array 103. NVM array 103 includes four NVM cells 105, 107, 109, and 111, which are shown for illustrative purposes as floating gate flash memory cells. It should be appreciated that NVM array 103 can include additional bitcells or other types of NVM cells (e.g., nano crystals, split gate flash, and nitride-based memories).

A row/gate voltage control circuit 117 is provided for generating gate voltages (Vg) that are provided to row decoder 115 and to memory controller 113. Row decoder 115 selectively provides gate voltages to word lines WL0 and WL1 during memory operations. The word lines are coupled to the gates of the memory cells of NVM array 103. NVM 101 also includes a column decoder and sense amplifier (CD/SA) circuit 121 having a sense amplifier that is coupled to bit lines BL0 and BL1 for reading the cells of NVM array 103. During memory operations, a drain voltage control circuit 125 supplies a drain voltage (Vdrain) to bit lines BL0 and BL1. In addition, reference circuit 123 supplies a variable reference current (Iref) to a reference sense amplifier in CD/SA circuit 121 for reading/sensing logic states of bitcells 105, 107, 109 and 111. In one example of NVM technology, the sense amplifier output for a bitcell is a logic state 0 (non-conducting) when the bitcell drain current is less than the reference current, and is a logic state 1 (conducting) when the bitcell drain current is higher than the reference current. CD/SA circuit 121 outputs data read from the cells on data lines.

Reference circuit 123 can take a variety of forms configured for trimming in accord with embodiments of the present invention. In one embodiment, reference circuit 123 includes a floating gate bitcell-based reference. The floating gate bitcell-based reference can be a bitcell in NVM array 103, but protected from programming. A reference cell in the NVM array will have the same characteristics as the other bitcells in the NVM array and will be subject to the same environmental conditions as the other bitcells in the NVM array. In another embodiment of an NVM 101 usable with embodiments of the present invention, reference circuit 123 includes a bandgap-based reference, which is a digitally trim-able reference current circuit that mimics the output current behavior of a bitcell-based reference. Trimming of the bandgap-based reference is performed by adjusting a control register. An advantage of the bandgap-based reference is that operational drift of such a reference is typically smaller than that of a floating gate bitcell-based reference.

Memory controller 113 controls memory operations of NVM array 103 during read, write, and test operations. Memory controller 113 is coupled to row/gate voltage control 117, reference circuit 123, drain voltage control 125, and source control 127, in order to control the voltage and current values provided by those circuits to NVM array 103 during memory and test operations. Memory controller 113 also provides control information for the operations of row decoder 115 and CD/SA 121 during memory and test operations. During such operations, memory controller 113 includes address, data, and control lines for receiving address, data and control information from a processor or external tester 150. Processor 150 can be on the same integrated circuit or on a different integrated circuit as NVM 101.

Figure 2:
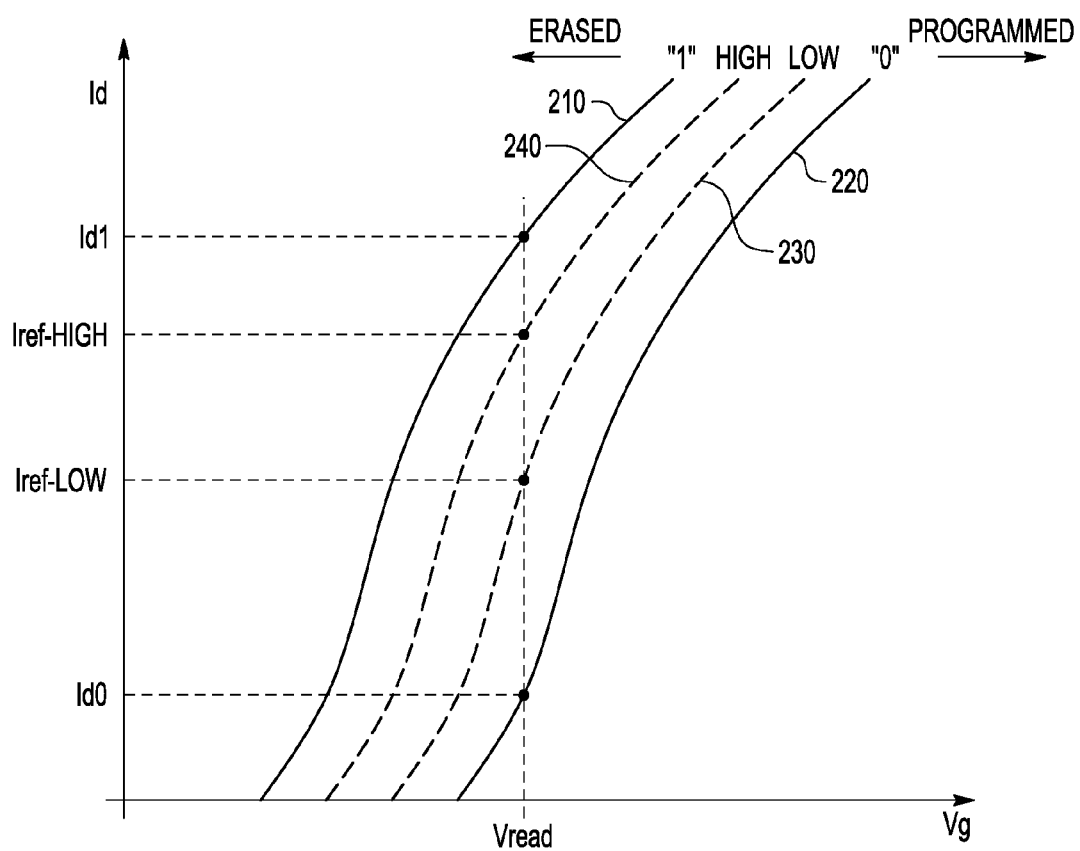
FIG. 2 is a graphical illustration of a control gate voltage versus drain current of a reference bitcell, in accord with embodiments of reference circuit that includes a floating gate bitcell-based reference.

FIG. 2 is a graphical illustration of a control gate voltage versus drain current of a reference bitcell, an erased bitcell, and a programmed bitcell, in accord with embodiments of reference circuit 123 that incorporate a floating gate bitcell-based reference. When calibrated, a read voltage (Vread) on the control gate of the reference bitcell results in a reference current (Iref) at the drain of the reference bitcell (Id). As discussed above, this calibrated reference current is used to determine the state of bitcells in NVM array 103 (e.g., programmed or erased). If the reference bitcell is operating within the predetermined acceptable performance range illustrated as between curve 230 ("Low") and curve 240 ("High"), then the produced Iref at a specific Vread is sufficient to access of bitcells in NVM array 103. This operational range of Iref is illustrated as an Id between Iref_Low and Iref_High. This will maintain a read margin from the reference current to the NVM array bitcell current. In FIG. 2, curve 210 is associated with an erased bitcell having a drain current of Id1 that is greater than Iref_High for Vread. Curve 220 is associated with a programmed bitcell having a drain current of Id0 that is less than Iref_Low for Vread. If Iref is outside the operational range, then the reference bitcell should be trimmed so that bitcells in NVM array 103 can continue to be accessed.

For a floating gate bitcell-based reference, if Iref falls below Iref_Low, then the reference bitcell should be subject to an erase cycle. If Iref rises above Iref_High, then the reference bitcell should be subject to a program cycle. These trim operations should result in resetting the floating gate bitcell-based reference to within the illustrated operational parameters.

For a bandgap-based reference, the goal is to keep Iref within similar operational parameters to those exhibited by a floating gate bitcell-based reference. Thus, if Iref falls below Iref_Low, then the bandgap-based reference is adjusted using a digital trimming procedure to raise Iref above Iref_Low by adjusting an Iref control register value. Similarly, if Iref rises above Iref_High, then the bandgap-based reference is adjusted using the digital trimming procedure to lower Iref below Iref_High by adjusting the Iref control register value.

Figure 3:
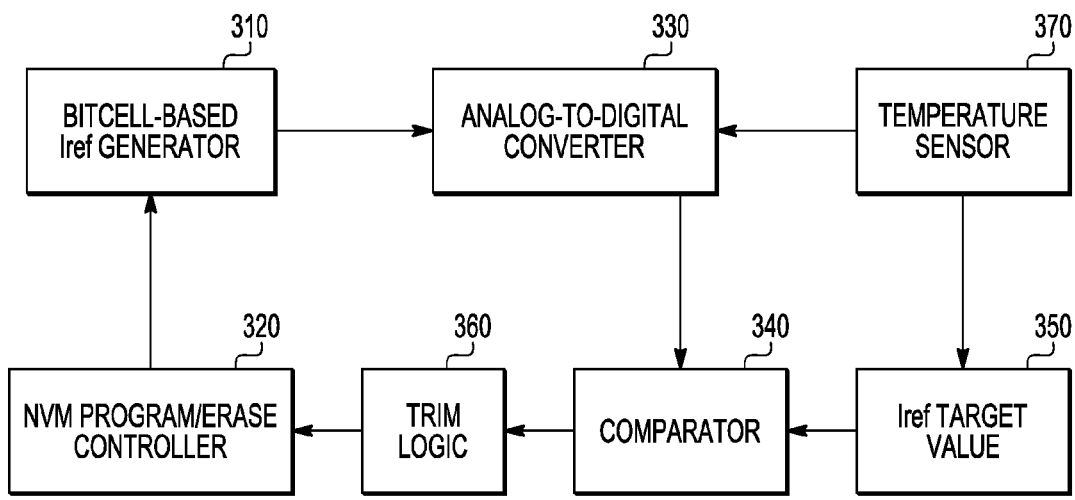
FIG. 3 is a simplified block diagram illustrating an example of components associated with a reference circuit including a floating gate bitcell-based reference, in accord with embodiments of the present invention.

FIG. 3 is a simplified block diagram illustrating an example of components associated with reference circuit 123 including a floating gate bitcell-based reference, in accord with embodiments of the present invention. Bitcell-based reference generator 310 includes one or more floating gate bitcell-based reference cells. As discussed above, these reference cells can be incorporated in NVM array 103, thereby ensuring that the reference cells are exposed to the same environmental conditions and initial processing conditions of the other bitcells in the NVM array. Bitcell-based reference generator 310 receives input from an NVM program/erase controller 320, which provides program or erase pulses to a reference cell, should that reference cell be in need of trimming. NVM program/erase controller 320 can be part of memory controller 113.

A reference cell 310 provides a generated Iref to analog-to-digital converter (ADC) 330. ADC 330 converts Iref to a digital value which can be stored in a register and provided to comparator 340. Comparator 340 compares the digital Iref value with an Iref target value 350 stored in a separate register. If the comparison between the digital Iref value and the Iref target value are within a predetermined range (e.g., between Iref_Low and Iref_High), then no trimming of the reference cell generating Iref is necessary. On the other hand, if the comparison between the digital Iref value and the Iref target value exceeds the predetermined range, then trim logic 360 provides a control signal to NVM program/erase controller 320 to apply either a program or an erase pulse to the reference cell.

Environmental characteristics, such as temperature, can affect behavior of both reference cells 310 and bitcells in NVM array 103. Therefore, embodiments of the present invention can provide for environmental sensors to signal available offsets to both the results generated by ADC 330 and the stored Iref target value 350. As illustrated in FIG. 3, a temperature sensor 370 is coupled to both ADC 330 and Iref target value register 350 in order to provide data used in offsetting those values.

Figure 4:
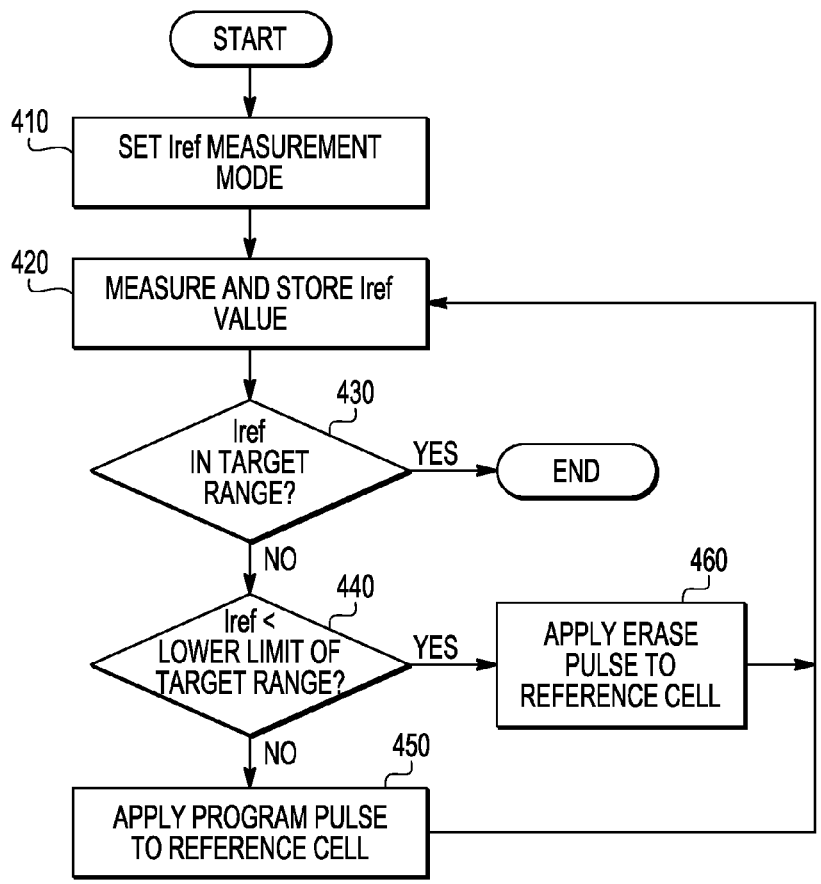
FIG. 4 is a simplified flow diagram illustrating a process for performing the built-in self-trim operations of embodiments of the present invention incorporating a floating gate bitcell Iref circuit.

FIG. 4 is a simplified flow diagram illustrating a process for performing the built-in self-trim operations of embodiments of the present invention incorporating a floating gate bitcell Iref circuit. Initially, an Iref measurement mode can be set or triggered (410). The Iref measurement mode can be set, for example, automatically when a system incorporating NVM 101 is restarted, or upon receiving an external or internal (e.g., periodic or otherwise triggered) command. Once the Iref measurement mode is initiated, the Iref value can be measured and stored (420). As discussed above, the measurement of the Iref value can be performed by an ADC that then stores the digitally-converted value in a register.

A determination is then made as to whether Iref is in a predetermined range of a target value (430) (e.g., between Iref_Low and Iref_High). As illustrated above, in one embodiment, this determination can be made, for example, by a comparator. For example, by comparing Iref is lower than the predetermined Iref_Low and/or higher than the predetermined Iref_High. If Iref is within the predetermined range of the target value, then the built-in self-trim process ends. If Iref is outside of the target range, then a determination is made as to whether Iref is less than a lower limit of the target range (440). If Iref is less than a lower limit of the target range, then an erase pulse is applied to the reference cell (460). If Iref is greater than an upper limit of the target range, then a program pulse is applied to the reference cell (450). As discussed above, in one embodiment, trim logic 360 performs the determination of whether to apply a program or an erase pulse to the reference cell. Once the program or erase pulse is provided to the reference cell, measurement of the generated Iref from the reference cell is performed again to determine whether the reference cell is now within acceptable operating parameters.

Figure 5:
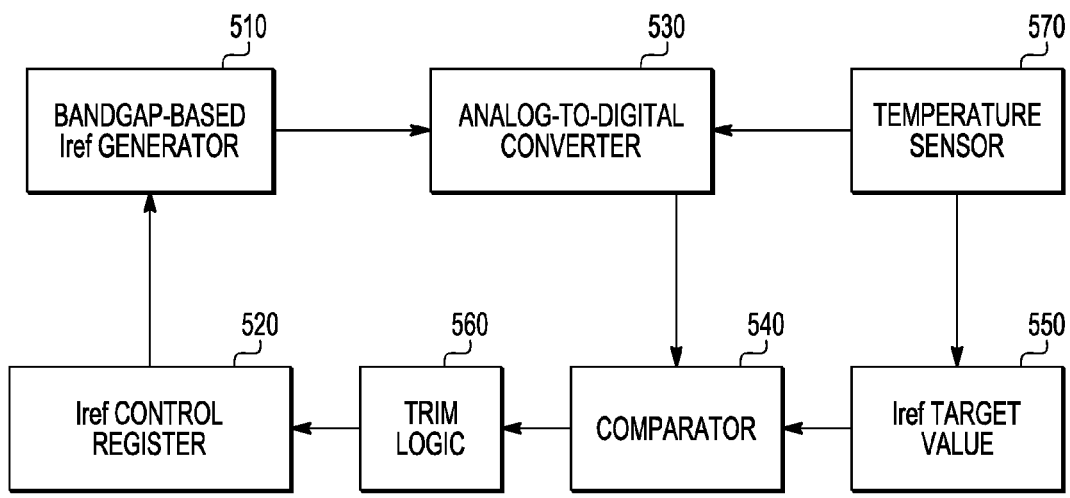
FIG. 5 is a simplified block diagram illustrating an example of components associated with reference circuit including a bandgap-based reference, in accord with embodiments of the present invention.

FIG. 5 is a simplified block diagram illustrating an example of components associated with reference circuit 123 including a bandgap-based reference, in accord with embodiments of the present invention. Bandgap-based Iref generator 510 includes one or more digitally trim-able reference current circuits, as discussed above. Bandgap-based Iref generator 510 can receive input from an Iref control register 520, which provides information used by the bandgap-based Iref generator to generate a reference current. Iref control register 520 can take a number of forms and, for example, can be part of memory controller 113.

Bandgap-based Iref generator 510 can provide a generated reference current to analog-to-digital converter (ADC) 530. ADC 530 converts Iref to a digital value which can be stored in a register and provided to comparator 540. Comparator 540 compares the digital Iref value with an Iref target value 550 stored in a separate register. If the comparison between the digital Iref value and the Iref target value are within a predetermined range, then no trimming of the bandgap-based Iref generator is as set. On the other hand, if the comparison between the digital Iref value and the Iref target value exceeds a predetermined range, then trim logic 560 provides an adjusted value to Iref control register 520. This adjusted value will change the reference current generated by the bandgap-based Iref generator.

As discussed above, environmental characteristics can also affect behavior of the bandgap-based Iref generator. Therefore, embodiments of the present invention can provide for environmental sensors to signal available offsets to both results generated by ADC 530 and the stored Iref target value 550. As illustrated in FIG. 5, a temperature sensor 570 is coupled to both ADC 530 and Iref target value register 550 in order to provide data used in offsetting those values.

It should be understood that embodiments of the present invention are not limited to environmental characteristics measured by temperature sensors, but can also include sensors for other types of environmental conditions influencing reference current or adjustment of one or more of an ADC, stored register values, and the like.

Figure 6:
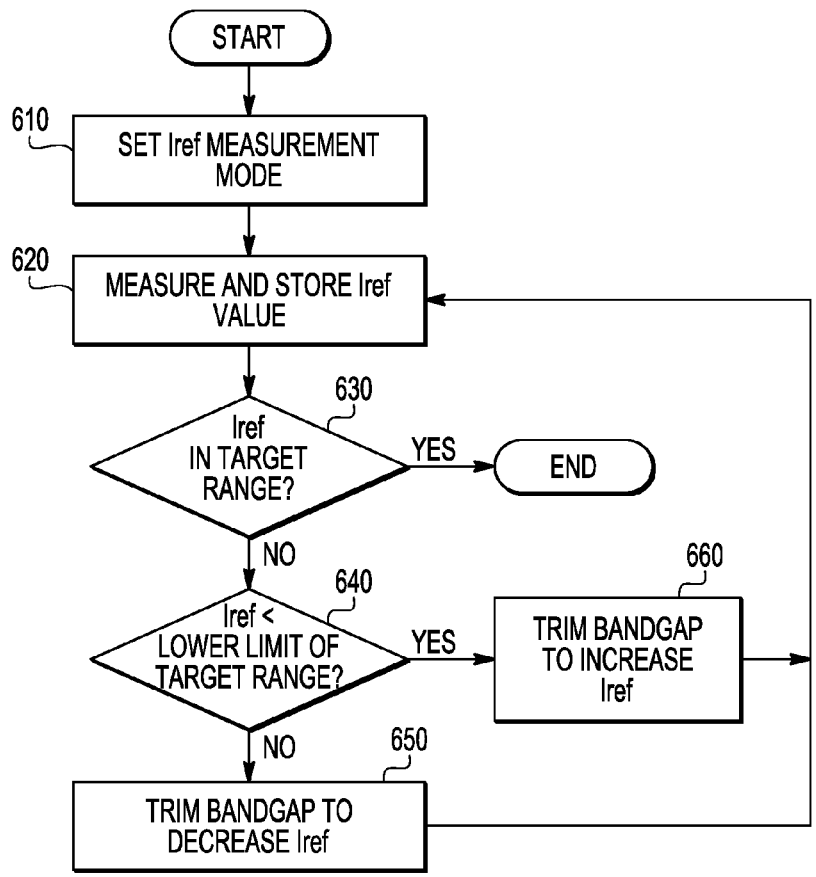
FIG. 6 is a simplified flow diagram illustrating a process for performing the built-in self-trim operations of embodiments of the present invention incorporating a bandgap-based Iref generator.

FIG. 6 is a simplified flow diagram illustrating a process for performing the built-in self-trim operations of embodiments of the present invention incorporating a bandgap-based Iref generator. The illustrated process is similar to that discussed above with regard to FIG. 4. Initially, an Iref measurement mode can be set (610). Once the Iref measurement mode is initiated, the generated Iref value can be measured and stored (620).

A determination is then made as to whether Iref is in a predetermined range of a target value (630). As illustrated above, in one embodiment, this determination can be made by a comparator. If Iref is within the predetermined range of the target value, then the built-in self-trim process ends. If Iref is outside of the target range, then a determination is made as to whether Iref is less than a lower limit of the target range (640). If Iref is less than the lower limit of the target range, then the bandgap circuit is trimmed to increase Iref (660) (e.g., by adjusting the reference current control register). As discussed above, this can be performed, for example, by providing an adjusted value to Iref control register 520. If Iref is greater than an upper limit of the target range, then the bandgap circuit is trimmed to decrease Iref (650) (e.g., by adjusting the reference current control register). As discussed above, in one embodiment, trim logic 560 performs the determination of whether to increase or decrease Iref. Once the bandgap-based Iref generator is adjusted, measurement of the generated Iref is performed again to determine whether the reference current is now within the target operating range.

By now it should be appreciated that there has been provided a method including converting a non-volatile memory reference current to a digital NVM reference current value, comparing the digital NVM reference current value to limits of a target value range, and adjusting the generator of the NVM reference current to produce an adjusted NVM reference current having an adjusted NVM reference current value within the target value range if the digital NVM reference current value is outside the target value range. Converting the NVM reference current to the digital NVM reference current value can be performed by an analog-to-digital converter coupled to the generator of the NVM reference current. The converting, comparing and adjusting are performed by components of a system-on-a-chip that comprises the NVM.

In one aspect of the above embodiment, adjusting the generator of the NVM reference current to produce an adjusted NVM reference current includes applying an erase pulse to the generator of the NVM reference current if the digital NVM reference current value is less than the target value range, and applying a program pulse to the generator of the NVM reference current if the digital NVM reference current value is greater than the target value range. Embodiments of this aspect include a floating gate reference bitcell in the generator of the NVM reference current. In a further aspect, the generator the NVM reference current is coupled to an NVM array including a plurality of floating gate bitcells and the floating gate reference bitcell is a member of the plurality of floating gate bitcells.

In another aspect of the above embodiment, adjusting the generator of the NVM reference current to produce an adjusted NVM reference current includes trimming a bandgap circuit to increase the NVM reference current if the digital NVM reference current value is less than the target value range, and trimming the bandgap circuit to decrease the NVM reference current if the digital NVM reference current value is greater than the target value range. Embodiments of this aspect include a bandgap-based circuit in the generator of the NVM reference current. In a further aspect, trimming the bandgap circuit includes adjusting a reference current control register value.

Another aspect of the above embodiment includes adjusting the digital NVM reference current value and the target value range in response to a measured temperature value.

Another embodiment of the present invention provides a system including: a non-volatile memory array, an NVM reference current generator configured to generate an NVM reference current used to access the NVM array, an ADC coupled to the NVM reference current generator and configured to convert the NVM reference current to a digital NVM reference current value, a comparator coupled to the ADC and configured to compare the digital NVM reference current value to a target value, and trim logic coupled to the comparator and configured to provide a control signal for the NVM reference current generator to produce an adjusted NVM reference current if the digital NVM reference current value is outside a range of the target value. A digital adjusted NVM reference current value associated with the adjusted NVM reference current is within the range of the target value.

One aspect of this embodiment further includes an NVM program/erase controller, coupled to the trim logic and the NVM reference current generator, and configured to: receive the control signal from the trim logic, provide an erase pulse to the generator the NVM reference current in response to the control signal if the control signal comprises an indicia that the digital NVM reference current value is lower than a lower limit of the range of the target value, and provide a program pulse to the generator of the NVM reference current in response to the control signal if the control signal comprises an indicia that the digital NVM reference current value is greater than an upper limit of the range of the target value. For this aspect the NVM reference current generator includes a floating gate reference bitcell. In a further aspect, the NVM array includes the floating gate reference bitcell. Another aspect includes one or more registers coupled to the comparator and storing the lower limit of the range the target value and the upper limit of the range of the target value.

Another further aspect includes a temperature sensor coupled to one or more of the ADC and the registers and configured to provide temperature data to the one or more of the ADC and the registers. The ADC is further configured to adjust the digital NVM reference current value in response to the temperature data if needed, and the registers are further configured to adjust the lower limit of the range of the target value and the upper limit of the range of the target value in response to the temperature data if needed.

Another aspect of the above embodiment includes a register coupled to the ADC and the comparator for storing the digital NVM reference current value. Yet another aspect of the above embodiment further includes a control register coupled to the trim logic and the NVM reference current generator that is configured to store a value in response to the control signal from the trim logic, and the NVM reference generator further includes a bandgap circuit that in response to the values stored in the control register is trimmed to increase the NVM reference current if the digital NVM reference current value is less than the target value range and the bandgap circuit is trimmed to decrease the NVM reference current if digital NVM reference current value is greater than the target value range.

In another aspect, the NVM reference current generator is disposed in proximity to the NVM array so that both are exposed to substantially similar environmental conditions. In still another aspect, the ADC is further configured to perform the converting of the NVM reference current to a digital NVM reference current value in response to receiving a command to initiate said converting. In another aspect, the ADC is further configured to perform converting the NVM reference current to a digital NVM reference current value in response to a power cycling the system.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of NVM 101 are circuitry located on a single integrated circuit or within a same device. Alternatively, NVM 101 may include any number of separate integrated circuits or separate devices interconnected with each other. For example, processor 150 can be located on a same integrated circuit as NVM array 103 or on an integrated circuit discretely separate from other elements of NVM 101. Further, ADC 330 or 530 can be located on a same circuit as NVM array 103 or on an integrated circuit discretely separate from other elements of NVM 101 in order to conserve space. But, in order to provide for consistent environmental behavior, a floating gate reference bitcell or a bandgap-based Iref generate should be on the same circuit as the elements of an associated NVM array.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, NVM 101 is incorporated in a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   converting a non-volatile memory (NVM) reference current to a digital NVM reference current value, wherein said converting is performed by an analog-to-digital converter (ADC) coupled to a generator of the NVM reference current;
   comparing the digital NVM reference current value to a target value range;
   if the digital NVM reference current value is outside the target value range, adjusting the generator of the NVM reference current to produce an adjusted NVM reference current, wherein
      an adjusted digital NVM reference current value associated with the adjusted NVM reference current is within the target value range, and
      the target value range comprises a lower limit and an upper limit of the target value range;
   adjusting one or more of the digital NVM reference current value, the lower limit of the target value, and the upper limit of the target value in response to temperature data provided by a temperature sensor, if needed; and
   wherein said converting, comparing, and adjusting are performed by components of a system-on-a-chip comprising a NVM.

2. The method of claim 1 wherein said adjusting the generator of the NVM reference current to produce an adjusted NVM reference current comprises:
   applying an erase pulse to the generator of the NVM reference current, if the digital NVM reference current value is less than the target value range; and
   applying a program pulse to the generator of the NVM reference current, if the digital NVM reference current value is greater than the target value range, wherein
      the generator of the NVM reference current comprises a floating gate reference bitcell.

3. The method of claim 2, wherein
   the generator of the NVM reference current is coupled to a NVM array comprising a plurality of floating gate bitcells, and
   the plurality of floating gate bitcells comprises the floating gate reference bitcell.

4. The method of claim 1 wherein said adjusting the generator of the NVM reference current to produce an adjusted NVM reference current comprises:
   trimming a bandgap circuit to increase the NVM reference current, if the digital NVM reference current value is less than the target value range; and
   trimming the bandgap circuit to decrease the NVM reference current, if the digital NVM reference current value is greater than the target value range, wherein
      the generator of the NVM reference current comprises a bandgap-based circuit.

5. The method of claim 4 said trimming the bandgap circuit comprises adjusting a reference current control register value.

6. An apparatus comprising:
   means for converting a non-volatile memory (NVM) reference current to a digital NVM reference current value;
   means for comparing the digital NVM reference current value to a predetermined target value range;
   means for adjusting a generator of the NVM reference current to produce an adjusted NVM reference current, wherein
      an adjusted digital NVM reference current value associated with the adjusted NVM reference current is within the target value range, said adjusting being performed if the digital NVM reference current value is outside the target value range,
      the target value range comprises a lower limit and an upper limit of the target value range;
   means for adjusting one or more of the digital NVM reference current value, the lower limit of the target value, and the upper limit of the target value in response to temperature data provided by a temperature sensor, if needed; and
   wherein said means for converting, means for comparing, and means for adjusting are components of a system-on-a-chip comprising a NVM.

7. The apparatus of claim 6 wherein the means for adjusting the generator of the NVM reference current to produce an adjusted NVM reference current comprises:
   means for applying an erase pulse to the generator of the NVM reference current, if the digital NVM reference current value is less than the target value range;
   means for applying a program pulse to the generator of the NVM reference current, if the digital NVM reference current value is greater than the target value range, wherein
      the generator the NVM reference current comprises a floating gate reference bitcell.

8. The apparatus of claim 7, wherein
   the means for generating the NVM reference current is coupled to a NVM array comprising a plurality of floating gate bitcells, and
   the plurality of floating gate bitcells comprises the floating gate reference bitcell.

9. The method of claim 6 wherein the means for adjusting the generator of the NVM reference current to produce an adjusted NVM reference current comprises:
   means for trimming a bandgap circuit to increase the NVM reference current, if the digital NVM reference current value is less than the target value range;

means for trimming the bandgap circuit to decrease the NVM reference current, if the digital NVM reference current value is greater than the target value range, wherein the generator of the NVM reference current comprises a bandgap-based circuit.

\* \* \* \* \*